United States Patent [19]
Kojima

[11] Patent Number: 5,381,045
[45] Date of Patent: Jan. 10, 1995

[54] CIRCUIT FOR AC VOLTAGE APPLICATION IN SYNCHRONISM WITH PATTERN SIGNAL GENERATOR

[75] Inventor: Eiji Kojima, Tokyo, Japan

[73] Assignee: Ando Electric Co., Ltd., Tokyo, Japan

[21] Appl. No.: 103,848

[22] Filed: Aug. 9, 1993

[30] Foreign Application Priority Data

Aug. 28, 1992 [JP] Japan .................. 4-253790

[51] Int. Cl.6 .................. H03L 1/00; H03K 4/00
[52] U.S. Cl. .................. 327/141; 371/27; 327/100; 327/106
[58] Field of Search .................. 307/269; 328/14, 187; 371/27

[56] References Cited

U.S. PATENT DOCUMENTS 4,115,810 9/1978 Mikado .................. 328/14
4,849,702 7/1989 West et al. .................. 307/269
5,321,700 6/1994 Brown et al. .................. 371/27

Primary Examiner—John S. Heyman
Attorney, Agent, or Firm—Panitch Schwarze Jacobs & Nadel

[57] ABSTRACT

For testing of a device under test, an AC measurement voltable application circuit is provided wherein voltages to be applied to the device can be switched during measurement operation without using a separate circuit for a high voltage generation. Data for voltages to be applied to the device are written in respective addresses of a memory in a pattern synchronizing control circuit. This pattern synchronizing control circuit is synchronized with a signal generator and, by inputting mode register setting signal depending on whether the measurement is AC or DC measurement, a relay control circuit for a pin driver circuit is controlled and the application value data in the memory are inputted into a DC measurement unit so as to apply a voltage to the device.

4 Claims, 3 Drawing Sheets

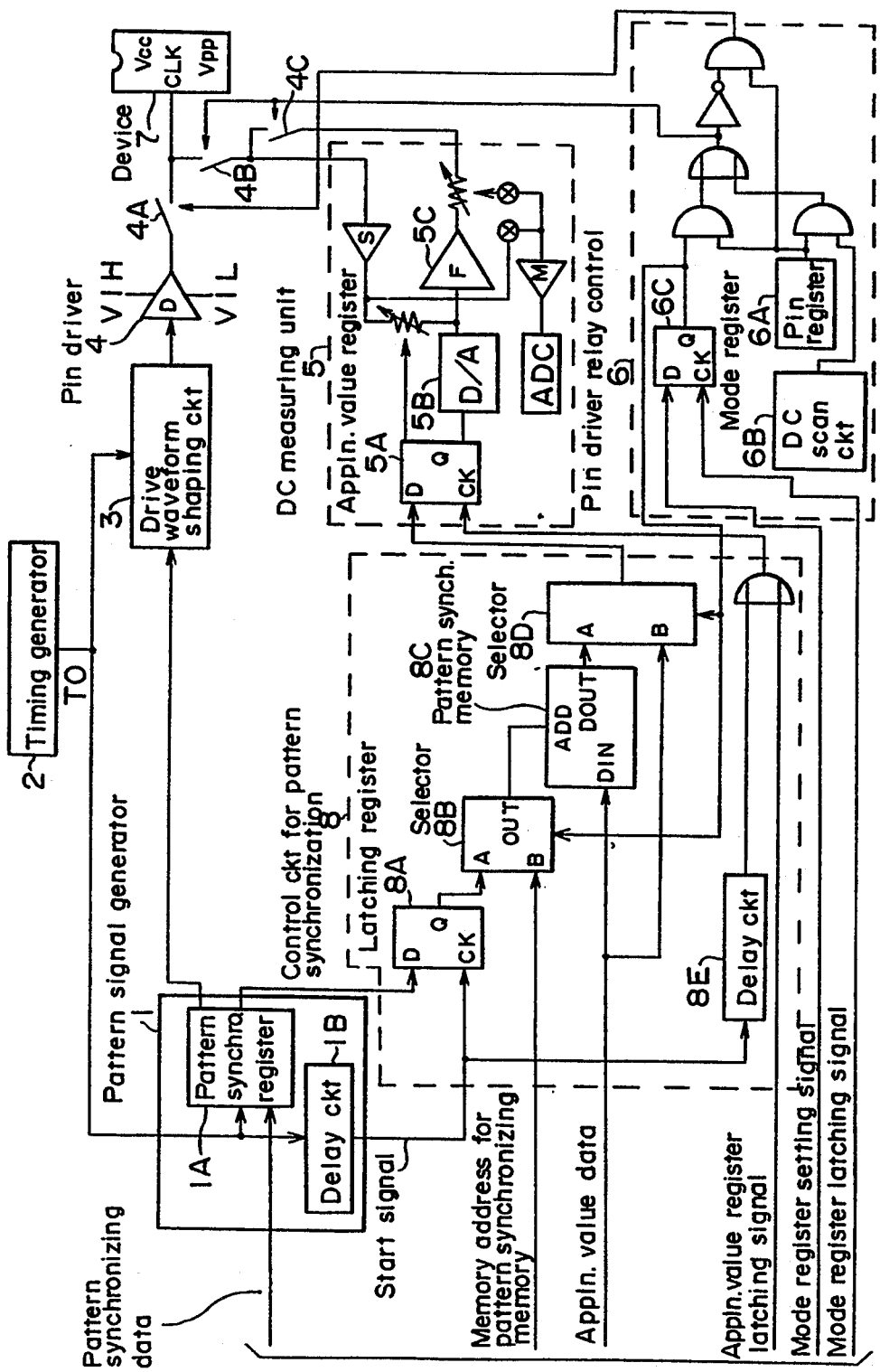
F I G. 1

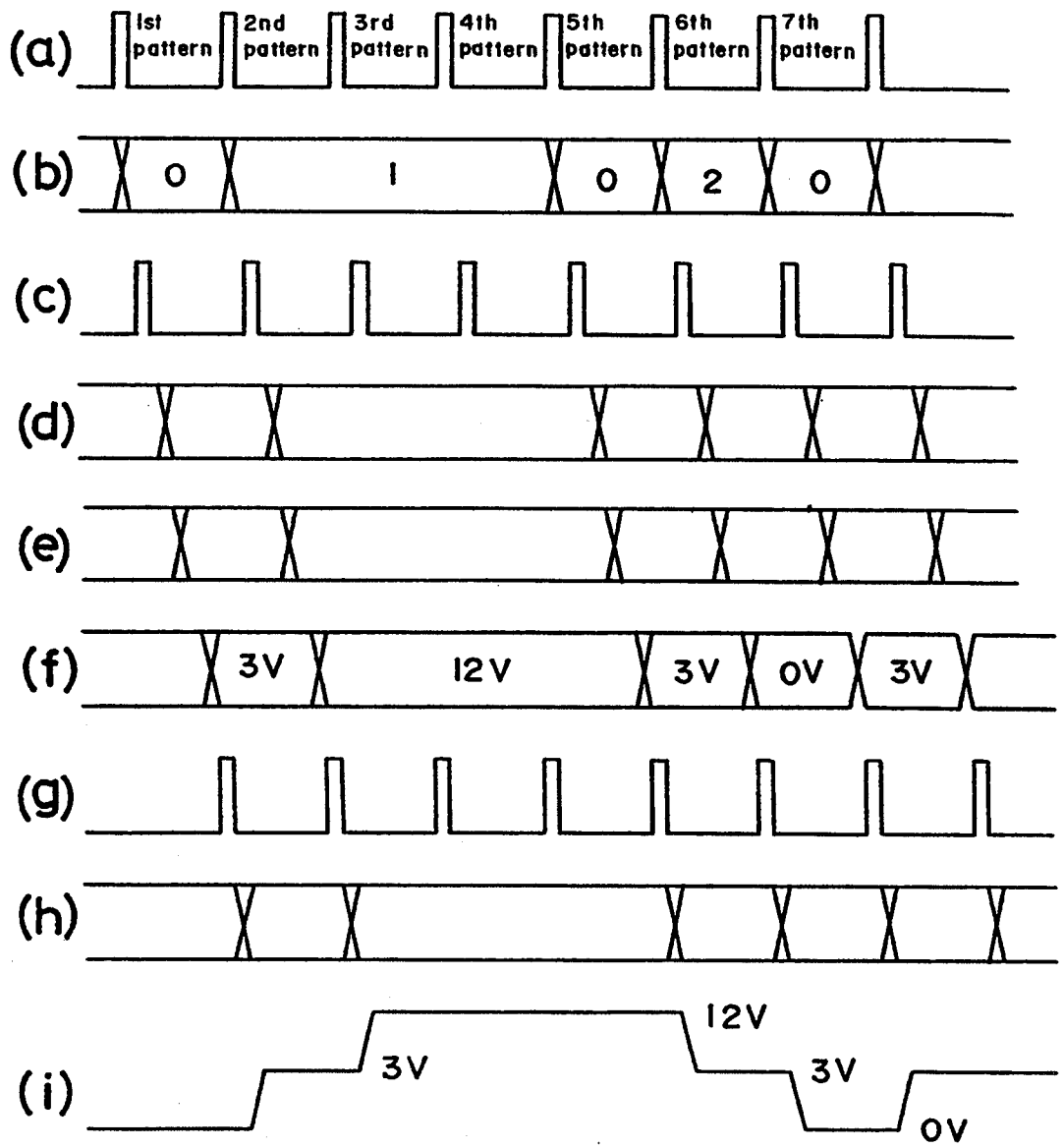

| Pattern synchronizing memory | |
|---|---|
| Address | Application value data |
| 0 | 3V |
| 1 | 12V |
| 1 | 12V |
| 1 | 12V |
| 0 | 3V |
| 2 | 0V |
| 0 | 3V |

CIRCUIT FOR AC VOLTAGE APPLICATION IN SYNCHRONISM WITH PATTERN SIGNAL GENERATOR

TECHNICAL FIELD OF THE INVENTION

For testing EPROM or the like, a high level voltage of +12 V or more and a normal level voltage of about +5 V are required for AC measurements. The present invention relates to a circuit for performing AC measurement by varying application voltage of DC measurement unit in synchronism with a pattern signal generator, without requiring additional hardware such as an electric source for high level voltage application.

PRIOR ART

In testing an EPROM, for example, there are two cases wherein a voltage is applied to a clock pin of a device to be measured for DC measurement, namely, voltage application/current measurement or current application/voltage measurement and wherein a high level voltage of +12 or higher is applied to a particular pin of a device and a normal or regular signal level voltage of +5 V or lower is applied to the pin for performing a programming test which is one of AC measurements.

A typical IC measurement circuit according to the conventional technique will be first shown in FIG. 5. In this figure, 11 is a pattern signal generator, 12 is timing generator, 13 is circuit for shaping a driving waveform, 14 is a pin driver circuit, 15 is a DC measurement unit, 16 is a relay control circuit for the pin driver circuit, 17 is a device under test (DUT), 18 is an electric source for generating a voltage to be applied to the device under test, 19 is a switching relay, and 20 is a relay control circuit. The DC measurement unit 15 receives application value data to be applied to the device 17 from a CPU (not shown) which is inputted to an application value data register 15A with a timing of a latching signal for the application value register. In FIG. 5, when a DC measurement is to be carried out, a relay 4A of the pin driver 14 is made off by the pin driver control circuit 16 and relays 4B and 4C are made on to connect the DC measurement unit 15 to the pin driver 14 and the switching relay 19 is shifted to the side of the pin driver 14 to connect the circuit 15 to the device 17.

When an AC measurement is to be carried out, the relay 4A of the pin driver control circuit 14 is made on by the relay control circuit 16 and the relays 4B and 4C are made off to separate the DC measurement unit 15 from the pin driver circuit 14. When a normal level voltage is to be applied to the device 17 the relay control circuit 20 shifts the switching relay 19 to the side of the pin driver circuit 14 to connect it to the device 17 and a pattern signal from the pattern signal generator 11 is inputted to the circuit 13 for shaping the driving waveform pattern signal with a timing of the timing generator 12. The shaped pattern signal is inputted via the pin driver 14 to the device 17. When a high level voltage is to be applied to the device 17, the relay control circuit 20 shifts the switching relay 19 to the side of the electric source 18 for the device 17.

PROBLEMS TO BE SOLVED BY THE PRESENT INVENTION

With the construction of FIG. 5, when a high level voltage is to be applied to the device in an AC measurement, an electric source for supplying such a high level is required because the pin driver circuit 14 cannot generate such a high level voltage, with the result that a switching relay and a relay control circuit for switching between the high level and the normal level voltage are required. Accordingly, in case a plurality of devices are to be simultaneously measured in parallel, greater number of the relays and relay control circuits are required with the increase in number of the devices to be measured, leading to a large scale of the circuit and making it difficult to provide a compact device.

Moreover, as it is not possible to change the voltage from the high level voltage to the low level voltage to be applied to the device under test during the measurement, it is required to conduct two separate measurements one after another by changing over the switching relay.

Accordingly, a principal object of the present invention is to provide an AC measurement voltage application circuit which does not require a separate electric source for high level voltage, is compact in size, and is capable of varying the voltage between a high level voltage and low level voltage during the measurement.

SUMMARY OF THE INVENTION

To achieve this object, the present invention provides a circuit for AC voltage application in synchronism with a pattern signal generator which comprises:

a circuit for applying AC voltage in synchronism with a pattern signal generator which comprises:

a pattern signal generator 1 for generating a pattern signal, including a pattern synchronizing register 1A to a first input terminal of which are inputted pattern synchronizing data and to second input terminal of which is inputted a timing signal;

a timing generator 2 for generating said timing signal;

a driving waveform shaping circuit 3 having an input terminal for receiving said pattern signal from the pattern signal generator 1, said circuit 3 functioning to shape said pattern signal with the timing of said timing signal from the timing signal generator 2 to form a driving waveform;

a pin driver circuit 4 which receives as an input said driving waveform from said driving waveform shaping circuit 3 to output a signal to a device under test;

a DC measurement unit 5 including an application value register 5A and applying a signal to the device 7;

a relay control circuit 6 for controlling the pin driver circuit 4, including a mode register 6C for selecting one of the output of the DC measurement circuit 5 and the output of the pin driver circuit 4;

a pattern synchronizing control circuit 8 comprising a latching register 8A for latching the output of the pattern synchronizing register 1A, a selector 8B having a first input terminal for receiving the output of the latching register 8A and having a second input terminal for receiving a pattern synchronizing memory address signal for selecting one of them, a pattern synchronizing memory 8C having an address input terminal for receiving the output of the selector 8B and a data input terminal for receiving an application value data, and a selector 8D having a first input terminal for receiving the output of said pattern synchronizing memory 8C and a second input terminal for receiving the application value data for selecting one of them;

whereby, when said mode register 6C sets a mode for synchronizing the voltage of the DC measurement unit 5 with the pattern signal generator 1, said relay control circuit 6 connects the DC measurement unit 5 with the device 7, and the selector 8B and the selector 8D select their respective first inputs as their respective outputs so as to vary the input data to the application value register 5A of the DC measurement unit 5 with the timing of the pattern signal generator 1.

BRIEF EXPLANATION OF THE DRAWINGS

FIG. 1 is a schematic diagram of the voltage applying circuit according to the present invention;

FIG. 2 shows time charts for explaining operation of the circuit FIG. 1;

FIG. 3 shows examples of data stored in the pattern synchronizing register;

DETAILED EXPLANATION OF THE INVENTION

Figures 4, 5:
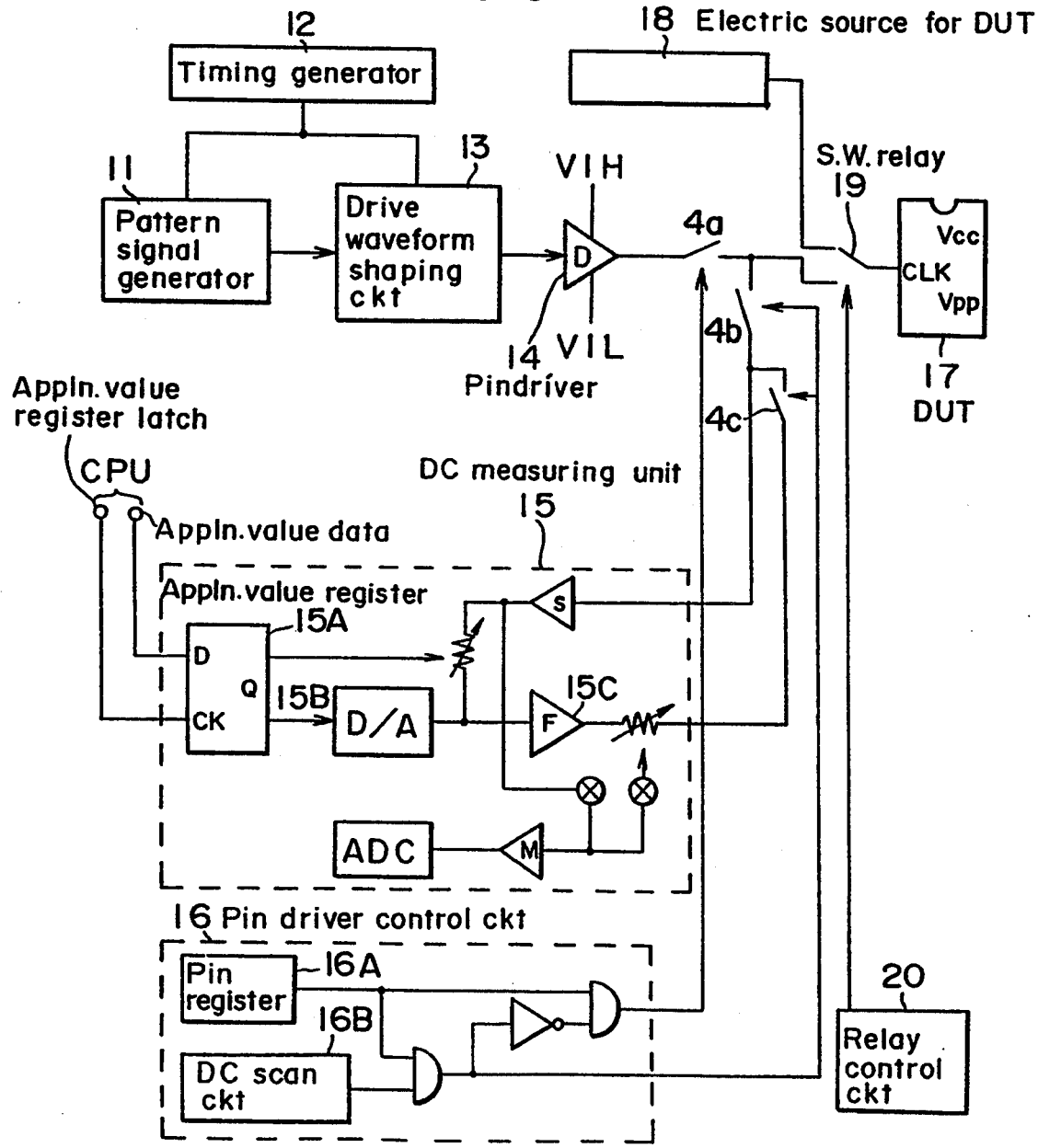
FIG. 4 shows examples of application value data be stored in the pattern synchronizing memory.
FIG. 5 is a voltage application circuit according to the conventional technique.

The IC measurement circuit according to an embodiment of the present invention is illustrated in FIG. 1. In this figure, 1 is a pattern signal generator, 2 is a timing generator, 3 is a circuit for shaping a driving waveform, 4 is a pin driver circuit, 5 is a DC measurement unit, 6 is a relay control circuit for a pin driver circuit, 7 is a device to be measured, 8 is a pattern synchronizing control circuit. The circuit in FIG. 1 does not utilize the electric source 18, the switching relay 19 and the relay control circuit 20 for the circuit in FIG. 5 but, instead, employs a pattern synchronizing control circuit 8. The timing generator 2, the circuit 3 for shaping a driving waveform, the pin driver circuit 4, the DC measurement unit 5 and the device 7 are similar to the timing generator 12, the circuit 13 for shaping a driving waveform 13, the pin driver circuit 14, the DC measurement unit 15 and the device 17 in FIG. 5.

The pattern signal generator 1 comprises a pattern synchronizing register 1A and a delay circuit 1B. Pattern synchronizing data from a CPU (not shown) are stored in the register 1A which are outputted from the register with a timing (namely, at timing intervals) from the timing generator 1. The pattern synchronizing control circuit 8 comprises a latching register 8A, a selector 8B, a pattern synchronizing memory 8C and a selector 8D. The latching register 8A latches the output of the pattern synchronizing register 1A with a timing from the timing generator 2 as delayed by the delay circuit 1B.

The selector 8B has a first input terminal which receives the output of the latching register 8A and a second input terminal which receives a pattern synchronizing memory address signal from the CPU. The pattern synchronizing memory 8C has an address input terminal, which receives the output of the selector 8B and a data input terminal which receives application value data from the CPU. The selector 8D has a first input terminal 2 which receives the output of the pattern synchronizing memory 8C and a second input terminal which receives the application value data from the CPU. The selectors 8B and 8C are controlled by a signal from the pin driver relay control, circuit 6 to select the respective first or second inputs. The DC measurement unit 5 includes an application value register 5A having a first input terminal which receives the output from the selector 8D and a second input terminal which receives a timing signal from a delay circuit 8E. The circuit 8E further delays the delayed timing signal from the delay circuit 1B. The application value data from the selector 8D are inputted to the register with the further delayed timing.

The relay control circuit 6 for the pin driver circuit 4 includes a mode register 6C and latches a mode register setting signal from the CPU with a mode register latching signal from the CPU. It should be noted that the pattern synchronizing data, the pattern synchronizing address signal, the application value data, the application value register latching signal, the mode register setting signal and the mode register latching signal have been set beforehand in the CPU prior to the test of the device.

OPERATION

Next, the operation of the circuit illustrated in FIG. 1 will now be explained in making reference to FIGS. 2-4. As shown in FIG. 3, data corresponding to pattern numbers (seven in this example) are written in the pattern synchronizing register 1A in FIG. 1 from CPU.

Application value data corresponding to the addresses designated by the output of the pattern synchronizing register 1A are written from the CPU into the pattern synchronizing memory 8C as shown in FIG. 4. In this case, the addresses of the pattern synchronizing memory 8C are those from the address signal for pattern synchronizing memory from the CPU while the output Q of the mode register 6C of the pin driver relay control circuit 6 is at a low level "L" and the B input of the selector 8B is selected.

When the mode register 6C sets a mode in which the application voltage of the DC measurement unit 5 is synchronized with the pattern signal generator 1, the output level Q of the mode register 6C becomes a high level "H" and the relays 4A, 4B and 4C of the pin driver 4 are so set that the relay 4A is off and the relays 4B and 4C are on, because the output of a pin register 6A in the relay control circuit 6 is at a high level "H" and the output of a mode scanning circuit 6B in the relay control circuit 6 is at a low level "L" with respect to the pin set by the pin register.

Accordingly, the output of the DC measurement unit 5 is connected to the clock terminal of the device 7. Further, the selector 8B of the pattern synchronizing control circuit 8 produces an address designating signal for the pattern synchronizing memory 8 corresponding to the pattern number from the pattern synchronizing register 1A and the timing output TO from the generator 2. More specifically, the output signal of the register 1A is sent to the latching register 8A and is latched to the latching register 8A by the output signal TO as delayed by the delay circuit 1B.

A latched datum in the latching register 8A makes access via the selector 8B to the designated address of the address pattern synchronizing memory 8C. The pattern synchronizing memory 8C outputs an application value datum corresponding the pattern number. The output datum from the pattern synchronizing memory 8C is sent via the selector 8D to the application value register 5A of the DC measurement unit 5 and is latched to the application value latching circuit 5A with the output signal TO as delayed by the delay circuit 1B and further delayed by the delay circuit 8E, which is then subjected to a D/A conversion with a D/A converter 5B and applied to the device 7 by way of the force amplifier and the relays 4C and 4B.

Referring to FIG. 2, (a) shows the output signal of the timing generator 2 which are pulses at uniform intervals.

(b) is the output signal of the pattern synchronizing register 1A which is data stored in the pattern synchronizing register 1A in FIG. 3 corresponding the pattern numbers in (a) of FIG. 2.

(c) shows the output signal of the delay circuit 1B and has a delay with respect to the pulses of (a).

(d) is the output signal of the latching register 8A.

(e) is the address input data to the pattern synchronizing memory 8C.

(f) shows the data output of FIG. 4 stored in the pattern synchronizing memory 8C which is application value data output corresponding to the addresses in (e) of FIG. 2.

(g) is a clock input signal of the application value register 5A of the measurement unit 5, which is outputted with a timing obtained by delaying the timing signal from the delay circuit 8E which, turn, is obtained by delaying the timing signal TO by the delay circuit 1b.

(h) is the output signal of the application value register 5A which outputs the signal of (f) with the timing (g) of FIG. 2.

(i) is a waveform of the voltage applied outputted from the DC measurement unit 5 based on the data (h) and supplied to the device 7.

From the foregoing, the data written in the pattern synchronizing memory shown in FIG. 4 are applied to the device as shown in FIG. 2.

ADVANTAGE RESULTING FROM THE INVENTION

According to present invention, a high level voltage required for an AC measurement is obtained by switching the relay of the pin driver circuit 4 to the DC measurement unit 5 with the relay control circuit 6 for the pin driver circuit, and the pattern signal from the pattern signal generator 1, the data stored in the pattern synchronizing control circuit 8 are read out and the data to be inputted to the application value register 5A are changed and applied from the DC measurement unit 5 to the device and accordingly, additional relays for switching the electric source or between high level and normal level voltage and even if the number of parallel measurement devices is increased, the circuit size can be reduced. In addition, since the data of voltage values are stored in the pattern synchronizing memory, normal level and high level voltages may be applied to the device during the measurement.

What is claimed is:

1. A circuit for applying AC voltage in synchronism with a pattern signal generator which comprises:
   a pattern signal generator (1) for generating a pattern signal, including a pattern synchronizing register (1A) to a first input terminal of which are inputted pattern synchronizing data and to a second input terminal of which is inputted a timing signal;
   a timing generator (2) for generating said timing signal;
   a driving waveform shaping circuit (3) having an input terminal for receiving said pattern signal from the pattern signal generator said circuit (3) functioning to shape said pattern signal with the timing of said timing signal from the timing signal generator (2) to form a driving waveform;
   a pin driver circuit (4) which receives as an input said driving waveform from said driving waveform shaping circuit (3) to output signal to a device under test;
   a DC measurement unit (5) including an application value register 5A and applying a signal to the device (7);
   a relay control circuit (6) for controlling the pin driver circuit including a mode register (6C) for selecting one of the output of the DC measurement circuit 5 and the output of the pin driver circuit (4);
   a pattern synchronizing control circuit (8) comprising a latching register (8A) for latching the output of the pattern synchronizing register (1A), a selector (8B) having a first input terminal for receiving the output of the latching register (8A) and having a second input terminal for receiving a pattern synchronizing memory address signal for selecting one of them, a pattern synchronizing memory (8C) having an address input terminal for receiving the output of the selector (8B) and a data input terminal for receiving an application value data, and a selector (8D) having a first input terminal for receiving the output of said pattern synchronizing memory (8C) and a second input terminal for receiving the application value data for selecting one of them;
   whereby, when said mode register (6C) sets a mode for synchronizing the voltage of the DC measurement unit (5) with the pattern signal generator (1), said relay control circuit (6) connects the DC measurement unit (5) with the device (7), and the selector (8B) and the selector (8D) select their respective first inputs as their respective outputs so as to vary the input data to the application value register (5A) of the DC measurement unit (5) with the timing of the pattern signal generator (1).

2. A circuit for applying AC voltage in synchronism with a pattern signal generator according to claim 1 wherein the latching register (8A) latches the output of the pattern synchronizing register (1A) with a timing from the timing generator (2) as delayed by a delay circuit (1B), the selectors (8B) and (8C) are controlled by a signal from the pin driver relay control circuit (6) to select the respective first or second inputs.

3. A circuit for applying AC voltage in synchronism with a pattern signal generator according to claim 1 wherein the application value register (5A) has a first input terminal which receives the output from the selector (8D) and a second input terminal which receives a timing signal from a delay circuit (8E) which receives the delayed timing signal from the delay circuit (1B) and an application value data from the selector (8D) are inputted to the register with the further delayed timing from the delay circuit (8E).

4. A circuit for applying AC voltage in synchronism with a pattern signal generator according to claim 1 wherein the mode register (6C) stores a mode register setting signal and is latched by a mode register latching signal.

* * * * *